(12) United States Patent
Menard

(10) Patent No.: US 8,506,867 B2
(45) Date of Patent: Aug. 13, 2013

(54) PRINTING SEMICONDUCTOR ELEMENTS BY SHEAR-ASSISTED ELASTOMERIC STAMP TRANSFER

(75) Inventor: Etienne Menard, Durham, NC (US)

(73) Assignee: Semprius, Inc., Durham, NC (US)

( * ) Notice: Subject to any disclaimer, the term of this patent is extended or adjusted under 35 U.S.C. 154(b) by 391 days.

(21) Appl. No.: 12/621,804

(22) Filed: Nov. 19, 2009

(65) Prior Publication Data

US 2010/0123268 A1 May 20, 2010

Related U.S. Application Data

(60) Provisional application No. 61/116,136, filed on Nov. 19, 2008.

(51) Int. Cl.
*B29C 59/00* (2006.01)

(52) U.S. Cl.
USPC .......................................................... 264/293

(58) Field of Classification Search
USPC .......................................................... 264/293
See application file for complete search history.

(56) References Cited

U.S. PATENT DOCUMENTS

| | | |
|---|---|---|
| 3,453,714 A | 7/1969 | Clark et al. |
| 4,503,335 A | 3/1985 | Takahashi |
| 5,151,386 A | 9/1992 | Bottani et al. |
| 5,512,131 A | 4/1996 | Kumar et al. |
| 5,669,303 A | 9/1997 | Maracas et al. |
| 5,789,117 A | 8/1998 | Chen |
| 5,817,242 A | 10/1998 | Biebuyck et al. |
| 5,937,758 A | 8/1999 | Maracas et al. |
| 5,947,027 A | 9/1999 | Burgin et al. |
| 6,062,133 A | 5/2000 | Blalock |
| 6,333,561 B1 | 12/2001 | Chen |
| 6,521,489 B2 | 2/2003 | Duthaler et al. |
| 6,675,465 B2 | 1/2004 | Ulrich |
| 6,740,543 B2 | 5/2004 | Rutiser |
| 6,792,856 B2 | 9/2004 | Hall et al. |
| 6,829,988 B2 | 12/2004 | George et al. |
| 6,855,378 B1 | 2/2005 | Narang |
| 6,876,081 B2 | 4/2005 | Chow |
| 6,881,366 B2 | 4/2005 | Hougham et al. |
| 6,918,982 B2 | 7/2005 | Afzali-Ardakani et al. |
| 6,976,424 B2 | 12/2005 | Bruno et al. |
| 7,117,790 B2 | 10/2006 | Kendale et al. |

(Continued)

FOREIGN PATENT DOCUMENTS

| | | |
|---|---|---|
| EP | 0794016 | 9/1997 |
| TW | 200710562 | 3/2007 |

(Continued)

OTHER PUBLICATIONS

U.S. Appl. No. 11/145,574, filed Jun. 2, 2005, Nuzzo et al.

(Continued)

*Primary Examiner* — Larry Thrower
(74) *Attorney, Agent, or Firm* — Lathrop & Gage LLP

(57) ABSTRACT

Provided are methods and devices for transfer printing of semiconductor elements to a receiving surface. In an aspect, the printing is by conformal contact between an elastomeric stamp inked with the semiconductor elements and a receiving surface, and during stamp removal, a shear offset is applied between the stamp and the receiving surface. The shear-offset printing process achieves high printing transfer yields with good placement accuracy. Process parameter selection during transfer printing, including time varying stamp-backing pressure application and vertical displacement, yields substantially constant delamination rates with attendant transfer printing improvement.

29 Claims, 11 Drawing Sheets

(56) References Cited

U.S. PATENT DOCUMENTS

| | | | |
|---|---|---|---|
| 7,195,733 | B2 | 3/2007 | Rogers et al. |
| 7,207,430 | B2 | 4/2007 | Davis et al. |
| 7,235,464 | B2 | 6/2007 | Bona et al. |
| 7,295,256 | B2 | 11/2007 | Kim |
| 7,296,519 | B2 | 11/2007 | Dona et al. |
| 7,363,854 | B2 | 4/2008 | Sewell |
| 7,429,552 | B2 | 9/2008 | Afzali-Ardakani et al. |
| 7,434,512 | B2 | 10/2008 | Bietsch et al. |
| 7,521,292 | B2 | 4/2009 | Rogers et al. |
| 7,557,367 | B2 | 7/2009 | Rogers et al. |
| 7,622,367 | B1 | 11/2009 | Nuzzo et al. |
| 7,704,684 | B2 | 4/2010 | Rogers et al. |
| 2002/0140298 | A1 | 10/2002 | Maruyama |
| 2003/0047535 | A1 | 3/2003 | Schueller et al. |
| 2003/0213382 | A1 | 11/2003 | Kendale et al. |
| 2005/0062066 | A1 | 3/2005 | Bao et al. |
| 2005/0103270 | A1 | 5/2005 | Yoshida et al. |
| 2005/0173049 | A1 | 8/2005 | Dona et al. |
| 2006/0196377 | A1 | 9/2006 | Loopstra et al. |
| 2006/0234499 | A1 | 10/2006 | Kodera et al. |
| 2006/0286488 | A1 | 12/2006 | Rogers et al. |
| 2006/0286785 | A1 | 12/2006 | Rogers et al. |
| 2007/0032089 | A1 | 2/2007 | Nuzzo et al. |
| 2007/0280578 | A1 | 12/2007 | Glebov et al. |
| 2008/0000373 | A1 | 1/2008 | Petrucci-Samija et al. |
| 2008/0055581 | A1 | 3/2008 | Rogers et al. |
| 2008/0108171 | A1 | 5/2008 | Rogers et al. |
| 2008/0157235 | A1 | 7/2008 | Rogers et al. |
| 2009/0199960 | A1 | 8/2009 | Nuzzo et al. |
| 2010/0002402 | A1 | 1/2010 | Rogers et al. |
| 2010/0018420 | A1 | 1/2010 | Menard |
| 2010/0052112 | A1 | 3/2010 | Rogers et al. |

FOREIGN PATENT DOCUMENTS

| | | |
|---|---|---|
| TW | 200738553 | 10/2007 |
| TW | 2008/48812 | 12/2008 |
| TW | 200904640 | 2/2009 |
| WO | WO 97/06012 | 2/1997 |
| WO | WO 01/42858 | 6/2001 |
| WO | WO 03/065120 | 8/2003 |
| WO | WO 2005/104756 | 11/2005 |
| WO | WO 2005/122285 | 12/2005 |
| WO | WO 2006/130721 | 12/2006 |
| WO | WO 2007/126412 | 11/2007 |
| WO | WO 2008/030960 | 3/2008 |
| WO | WO 2008/036837 | 3/2008 |
| WO | WO 2008/047144 | 4/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/011713 | 1/2010 |
| WO | WO 2010/036807 | 4/2010 |

OTHER PUBLICATIONS

Benkendorfer et al. (Jun. 2007) "Printing Unities III—Vs and Silicon," *Compounds Semiconductor* 3 pages.

International Search Report and Written Opinion, Corresponding to International Application No. PCT/US09/51350, Mailed Sep. 24, 2009.

International Search Report and Written Opinion, Corresponding to International Application No. PCT/US2009/065078, Mailed Apr. 23, 2010.

Michel et al. (Sep. 2001) "Printing Meets Lithography: Soft Approaches to High-Resolution Patterning," *IBM J. Res. Dev.* 45(5):697-708.

Parker, J.L. (Aug. 1, 2006) "An Analytical Characterization of PCB Delamination and Comparison of Adhesion Tests," *Printed Circuit Design FAB* http://www.pcdandf.com/cms/magazine/172/2802-an-analytical-characterization-of-pcb-delamination-and-comparison-of-adhesion-tests.

Sun et al. (2004) "Fabricating Semiconductor Nano/Microwires and Transfer Printing Ordered Arrays of Them onto Plastic Substrates," *Nano Lett.* 4(10):1953-1959.

International Search Report and Written Opinion, Corresponding to International Application No. PCT/US2010/039414, Mailed Sep. 1, 2010.

European Search Report corresponding to Application No. 10802608.9, issued Oct. 30, 2012.

C

PRINTING SEMICONDUCTOR ELEMENTS BY SHEAR-ASSISTED ELASTOMERIC STAMP TRANSFER

This application claims the benefit of U.S. Provisional Patent Application No. 61/116,136 filed Nov. 19, 2008, which is specifically incorporated by reference to the extent not inconsistent herewith.

STATEMENT REGARDING FEDERALLY SPONSORED RESEARCH OR DEVELOPMENT

This invention was made, at least in part, with United States governmental support awarded by National Science Foundation Grant IIP-0712017. The United States Government has certain rights in this invention.

BACKGROUND OF THE INVENTION

Semiconductor chip or die automated assembly equipments typically rely on the use of vacuum operated placement heads often referred to as vacuum grippers or pick-and-place tools. In their simplest embodiment, these placement heads typically consist of an open ended cylinder having a drilled nozzle surface which seals to the die to accomplish physical attachment. Semiconductor chips or die which are ultra thin, fragile, or too small cannot be economically handled by conventional vacuum grippers. As a result, alternative approaches such as self-assembly or dry transfer printing technologies are being investigated.

Transfer printing enables the massively parallel assembly of high performance semiconductor devices onto virtually any substrate material, including glass, plastics, metals or other semiconductors (see, e.g., U.S. patent application Ser. No. 11/145,574 METHODS AND DEVICES FOR FABRICATING AND ASSEMBLING PRINTABLE SEMICONDUCTOR ELEMENTS filed Jun. 2, 2005). This semiconductor transfer printing technology relies on the use of a microstructured elastomeric stamp to selectively pick-up devices from a source wafer and then prints these devices onto a target substrate. The transfer process is massively parallel as the stamps are designed to transfer hundreds to thousands of discrete structures in a single pick-up and print operation.

While pick-and-place tools rely on suction forces, dry transfer printing tools rely on surface adhesion forces to control the pickup and release of the semiconductor devices. To enable dry transfer printing, methods to control the adhesion forces between the semiconductor elements and the elastomeric stamp are required. One such method is described in U.S. patent application Ser. No. 11/423,192 filed Jun. 9, 2006 titled "PATTERN TRANSFER PRINTING BY KINETIC CONTROL OF ADHESION TO AN ELASTOMERIC STAMP." In that method, the elastomeric stamp adhesion forces are controlled by adjusting the delamination rate of the elastomeric transfer stamp. This control of separation or delamination rate provides a means of increasing the stamp adhesion forces that are necessary to pickup semiconductor elements from a source wafer. There are problems, however, associated with transferring the semiconductor elements from the stamp to a receiving substrate with this technique. First, slow stamp delamination rates (<1 mm/s) are often required to transfer semiconductor elements onto bare target substrates or substrates coated with a low tack surface adhesive. This increases processing time and impacts the ability to achieve high-throughput transfer printing. Second, stamps optimized for dry transfer printing semiconductor elements with high placement accuracy typically use a stiff backing layer. During the printing or transfer step, the delamination rate of those stamps can be unstable and difficult to control when the stiff backing layer(s) are subject to bending forces. Third, printing yields on surfaces that are not ultra smooth, or low tack surfaces, can be very low.

Accordingly, there is a need for an improved method for transfer printing semiconductor elements with high yield and placement accuracy, the method, system and process being scalable to large-size elastomeric stamps.

SUMMARY OF THE INVENTION

Provided are methods and systems for dry transfer printing of semiconductors and semiconductor elements by shear offset. Shear offset printing systems permit higher delamination rates to be achieved during transfer printing without sacrificing printing yield or accuracy, compared to conventional techniques that do not apply a shear offset. Accordingly, methods and systems presented herein provide faster and more reliable transfer printing, thereby reducing processing time and increasing printing efficiency.

Increasing shear offset during the delamination process increases transfer yields. Shear offset causes mechanical deformations in the transfer stamp used to transfer the semiconductor elements and, thereby, lowers the energy required to initiate delamination of the transfer stamp surface from the semiconductor element. Another parameter important for good transfer yield (e.g., greater than 95% transfer) is constant delamination rate. Provided herein are techniques for optimizing a number of parameters to ensure delamination rate is constant with minimal deviations. For example, a stamp is designed to provide suitable delamination rate by optimizing one or more of composition of the deformable layer, geometry and pattern of relief features on the transfer surface of the deformable layer, Young's modulus, relative thickness of a rigid backing layer connected to the deformable layer. Other parameters that affect delamination rate include, but are not limited to, the rate at which the stamp is removed from the receiving substrate, as well as the force (e.g., pressure) used to establish conformal contact. In an aspect, each of these parameters varies over the course of the delamination cycle to minimize deviation of the delamination rate over the course of a printing step.

In an aspect, the invention is a method of printing a transferable semiconductor element, such as by providing an elastomeric stamp having a transfer surface. A semiconductor element is supported by the transfer surface. To further increase control and printing yield, the transfer surface that supports a semiconductor element may have a three-dimensional pattern of relief features that at least partially contacts the semiconductor element. The stamp "inked" with a semiconductor element is if brought into conformal contact with a receiving surface, such that at least a portion of a semiconductor element contacts the receiving surface. The receiving surface is optionally at least partially coated with an adhesive layer. Alternatively, the receiving surface is not coated with an adhesive. Alternatively, the receiving surface is patterned with a pattern of adhesive regions. The elastomeric stamp is offset a horizontal distance relative to the receiving surface, thereby generating a mechanical deformation in at least a portion of the pattern of relief features, wherein the offset does not separate the semiconductor element from the transfer surface or the receiving surface. The location that drives the offset is not important (e.g., one or both of stamp and receiving surface may be offset), as long as there is an offset between the receiving surface and transfer surface. "Horizontal offset" refers to an offset that is substantially parallel to the plane or surface defined by contact between the inked contact surface and the receiving substrate. The stamp is separated from the receiving surface, thereby printing the semiconductor element to the receiving surface.

In an aspect, conformal contact step is established, at least in part, by applying air pressure to a top surface of the elastomeric stamp. For example, the stamp may be brought into close proximity (e.g. about 100 µm or less) to the receiving surface, and air pressure applied to establish conformal contact. In the embodiment where the stamp is a composite stamp having a rigid backing layer, the top surface of the stamp corresponds to the top surface (e.g., exposed surface, or the surface that is opposite to the transfer surface). It is understood that "top" surface is a relative term used to distinguish the surface that is opposite the transfer surface, so that depending on the geometrical configuration of the system, the top surface may, in fact, be placed in a downward facing position.

Offsetting may be by any means known in the art, so long as the end result is the movement of the transfer surface relative to the receiving surface. In an embodiment, the offsetting is by application of an in plane displacement to the elastomeric stamp. In an embodiment, the in plane displacement is achieved by a horizontal displacement of the stamp top surface relative to the receiving surface that is greater than 5 µm and less than 100 µm.

In an aspect, the separating step comprises decreasing the air pressure applied to the stamp top surface. Alternatively, the separating step comprises physically moving the stamp in a vertical direction away from the receiving surface. In an aspect, the separating step comprises both decreasing the air pressure and movement in a vertical direction, such as simultaneously or in a sequential fashion.

In an embodiment, any of the stamps used in any of the processes or devices disclosed herein may be a composite stamp. In an aspect, the elastomeric stamp has an elastomeric layer with a top surface that is opposite the transfer surface and a rigid backing layer having a bottom surface, wherein the bottom surface is positioned adjacent to the elastomeric layer top surface. Such elastomeric stamps having a rigid backing layer are advantageous for transferring applied pressure and motion (e.g., vertical and/or horizontal) to the interface between the transfer surface and the inked semiconductor element and/or the receiving substrate surface. For example, air pressure applied to the rigid backing can be uniformly transmitted to the active printing area. In another aspect, the elastomeric stamp also has a reinforcement layer operably connected to the rigid backing layer, the reinforcement layer having an opening that vertically coincides with at least a portion of the relief features on the transfer surface.

In an aspect, any of the methods provided herein further include mounting an elastomeric stamp to a dry transfer printing tool. The offset step is optionally accomplished by applying an in plane displacement to the dry transfer printing tool, thereby generating a mechanical deformation of at least a portion of the relief features. "In plane displacement" refers to offset that is in a substantially parallel direction to the interface that will be undergoing delamination. In this aspect, "substantially parallel" refers to a direction that is within 2° of the surface or planed defined by the interface.

In an embodiment of the invention, conformal contact is established, at least in part, by applying a pressure to a top surface of the mounted stamp, such as a top surface that is a rigid backing layer.

In aspects where the stamp is separated from the receiving surface by moving one of the surfaces in a vertical direction, such as moving the transfer printing tool mounted to the elastomeric stamp in a vertical direction relative to the receiving surface, any one or more parameters may be varied during the delamination cycle. For example, the pressure applied to the stamp may vary during the vertical direction movement that separates the stamp from the receiving surface. In an embodiment, the pressure may decrease from a maximum value to a minimum value, such as a maximum value between 4 kPa and 10 kPa and a minimum value between 0 kPa and 2 kPa. In an aspect, the pressure decrease rate and the vertical direction movement rate are selected to provide a delamination rate of the stamp posts from the receiving surface (or from the semiconductor elements that are supported by the receiving surface) that is substantially constant.

In an embodiment the relief features comprise a plurality of posts. The posts can help facilitate semiconductor element lift-off from a donor surface and/or semiconductor element transfer from the stamp to the receiving surface. In an aspect of this embodiment, the plurality of posts have a contacting area fraction on the transfer surface selected from a range that is greater than 1% and less than 25%. "Contacting area fraction" refers to the percentage of surface area coverage by the posts over the printable surface area region. In an aspect where the relief features comprise a plurality of populations, the relief features may further comprise a plurality of stabilization features interspersed between the posts, wherein said stabilization features have a contacting area that is less than the contacting area of the posts.

In an aspect, any of the methods provided herein are described in terms of a functional parameter including, but not limited to, a transfer printing yield. For example, the process may provide a yield that is greater than or equal to 99.5% for a receiving surface that is coated with a thin layer of adhesive. Alternatively, the yield may be greater than or equal to 99.5% for stamp delamination rates that are greater than or equal to 1 mm/s.

In optional embodiments, any of the methods include optically aligning the stamp with the receiving surface, positioning the semiconductor elements to within less than or equal to 100 µm vertical separation distance from the receiving surface and applying a pressure to a top surface of the stamp to establish conformal contact between the stamp and the receiving surface. The pressure is applied by any means known in the art. For example, the pressure can be applied by application of a uniform air pressure to the stamp top surface, including a top surface corresponding to a rigid backing layer.

Any of the methods disclosed herein may be used to print a single semiconductor element or a plurality of semiconductor elements, wherein the pattern of relief features support the single or plurality of semiconductor elements.

In an aspect, the transfer methods provided herein are for transfer printing semiconductor elements to a receiving surface that is a low-tack surface.

The separating step is by any means known in the art including, but not limited to, displacing the stamp relative to the receiving surface by applying a vertical offset to the stamp and/or to the receiving surface. The application may be direct or indirect, such as by applying an offset to a structure that supports the surface. Similarly, the offsetting step is optionally provided by applying an in-plane displacement to the stamp, or applying an in-plane displacement to the receiving surface, applying in-plane displacements to both.

For aspects where air pressure is applied to at least partially establish said conformal contact and the stamp is vertically separated from the receiving surface, each of the air pressure and vertical separation rate may vary over time during the delamination cycle. For example, in embodiments where the delamination cycle is divided into at least two time intervals, with the first interval is before the second interval, and does not substantially overlap, the air pressure may vary over the first time interval while the vertical separation is maintained constant over this first time interval. In contrast, during the second time interval the air pressure may be maintained constant while the vertical separation increases during this second time interval. In this embodiment, selection of the pressure and separation distance with respect to time is an optimization step that helps facilitate a constant delamination rate over the delamination cycle, such a delamination rate that deviates less than or equal to a user-specified deviation, such as less than or equal to 5% from an average delamination rate over the first and second time intervals.

Another aspect of the invention relates to devices for dry transfer printing of semiconductors to a receiving substrate, such as devices that are capable of implementing any of the shear-offset processes disclosed herein.

In an embodiment, the device supports a reinforced composite stamp having a deformable layer with an internal surface and an external surface positioned opposite the internal surface, the external surface of the deformable layer having a plurality of relief features. A rigid support layer is connected to the internal surface of the deformable layer, wherein the rigid support layer has a bottom surface and a top surface positioned opposite the bottom surface, wherein the bottom surface is positioned proximate to the internal surface of the deformable layer. A reinforcement layer is operably connected to the rigid support layer, the reinforcement layer having an opening that vertically coincides with at least a portion of the relief features of the external surface of the deformable layer. In an embodiment, the composite stamp is supported by a vertical section that operably connects a mounting flange to the deformable layer external surface. A transfer printing tool head having a receiving surface connects the mounting flange top surface. An actuator is operably connected to the mounting flange or the transfer printing tool head for generating a horizontal displacement between the deformable layer internal surface and the receiving surface. Accordingly, the actuator may displace the stamp or the receiving substrate, thereby achieving offset between the stamp and the receiving substrate.

Any actuator may be used, so long as a controllable offset is achieved. Examples of actuators include, but are not limited to displacement actuators such as motors, stepper motor, drivers, micropositioner, or piezoelectric actuator. Other examples of offset generator actuators may not directly control displacement, but instead affect a physical parameter that in turn results in offset such as a pressure generator, a temperature controller or electric voltage generator.

The plurality of relief features optionally comprises a plurality of posts distributed on the external surface. In an embodiment, a plurality of stabilization features are distributed on the external surface, wherein the height of said stabilization features is less than the height of said posts. The stabilization features optionally comprise a first population and a second population, wherein each population has a geometric footprint and the first population geometric footprint is larger than the second population geometric footprint. "Geometric footprint" refers to the effective surface area that faces the receiving surface.

In an aspect, the device further includes a variable pressure regulator operably connected to the rigid support layer of the composite stamp for controllably applying a positive pressure to a top surface of the rigid support layer. The applied pressure is useful for establishing conformal contact between surfaces. In an embodiment, the pressure to a top surface is substantially uniform over the top surface of the rigid support layer.

In an embodiment, although at a given time the pressure is substantially uniform, the pressure may with time, such as varying with the time of a delamination cycle.

Without wishing to be bound by any particular theory, there can be discussion herein of beliefs or understandings of underlying principles or mechanisms relating to embodiments of the invention. It is recognized that regardless of the ultimate correctness of any explanation or hypothesis, an embodiment of the invention can nonetheless be operative and useful.

DETAILED DESCRIPTION OF THE INVENTION

Figure 1:
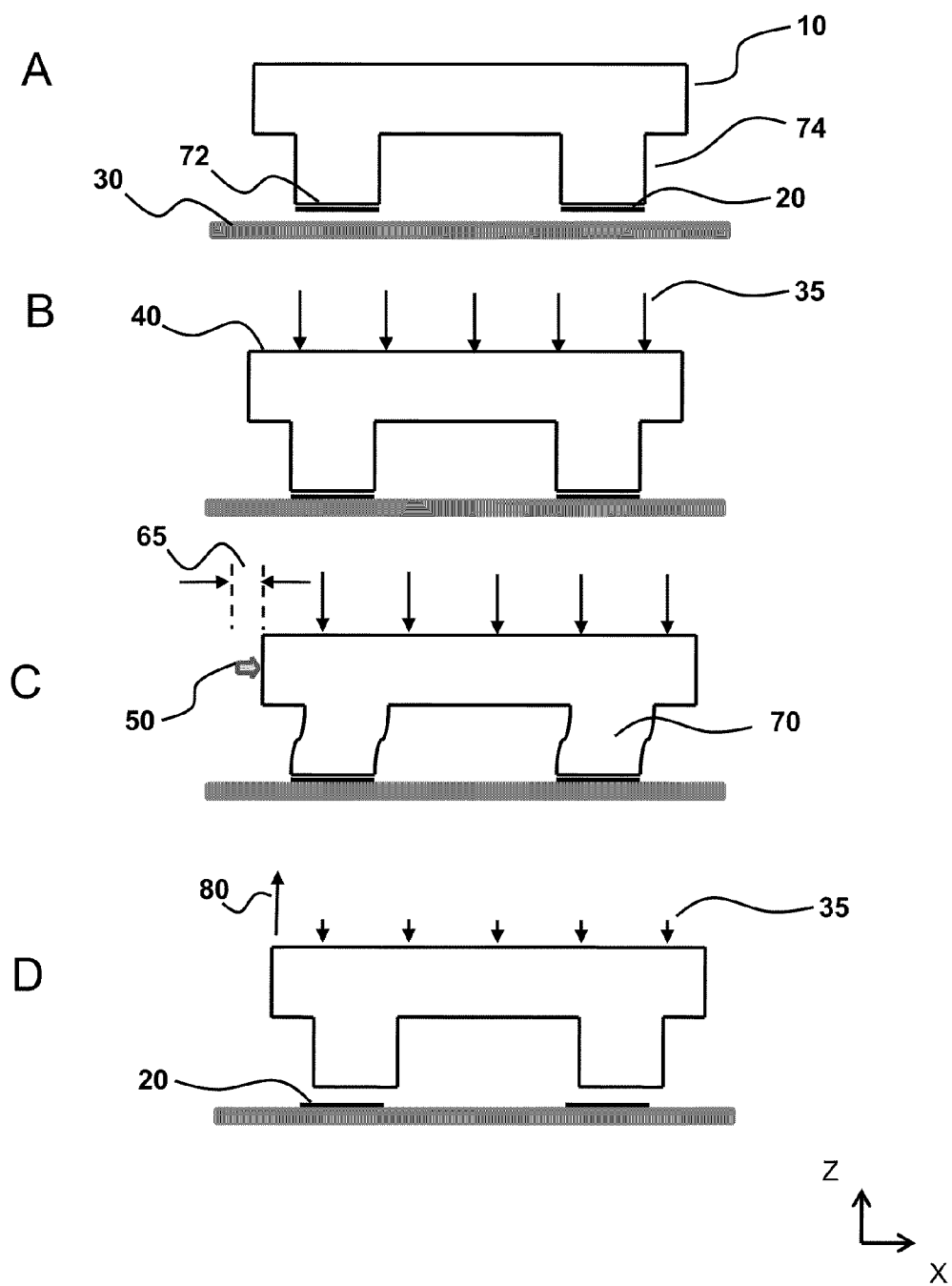
FIG. 1 is a process flow diagram with cross-section schematic views illustrating the steps to practice one embodiment of shear offset printing. A Align transfer printing stamp; B Laminate transfer printing stamp by applying air pressure on stamp backing; C Apply in plane shear on stamp posts by moving tool head by a given X and/or Y position offset; D Delaminate stamp by moving tool head up in the Z direction and simultaneously decreasing air pressure applied on stamp backing.

"Printing" refers to a process of transferring a feature, such as a semiconductor element, from a first surface to a second surface. In an aspect, the first surface is a donor surface and the second surface a receiving surface, and the transfer is mediated by an intermediate surface such as a stamp having a transfer surface. In an aspect, the first surface is a transfer surface on a stamp to which one or more semiconductor elements are supported, and the stamp is capable of releasing the elements to a receiving surface on a target substrate, thereby transferring the semiconductor element. In an aspect, the printing is dry transfer printing of printable semiconductors, wherein the adhesive force between a solid object and the stamp surface is rate-sensitive.

"Stamp" refers to a component for transfer, assembly and/or integration of structures and materials via printing, for example dry transfer contact printing. Composite stamps, such as composite stamps disclosed in U.S. Pat. No. 7,927,976, filed Aug. 29, 2008, hereby incorporated by reference, are particularly useful for pickup and release/print systems, wherein the stamp can be first laminated or contacted with a donor substrate to pickup micro or nanostructures from that donor substrate and subsequently brought into contact with a receiving substrate to which it transfers the micro- or nanostructures.

"Composite stamp" refers to a stamp having more than one component, such as more than one material. In an aspect, a composite stamp is made from a deformable layer and a rigid support layer, wherein the deformable and support layers have different chemical compositions and mechanical properties. The deformable layer optionally comprises a composite polymer layer, such as a reinforcement layer having a combination of one or more polymer and a fiber, such as a glass or elastomeric fiber, particulate, such as nanoparticles or microparticles or any combinations thereof.

The deformable layer may be an elastomer layer. "Elastomer" or "elastomeric" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly (styrene-butadiene-styrene), polyurethanes, polychloroprene and silicones.

"Supported" refers to a stamp that has received a semiconductor element, such as a micro or nanostructure that will form a semiconductor, on the stamp's surface (e.g., transfer surface) such that the element is capable of being transferred to another surface (e.g., a receiving surface). "Inking" refers to the step of pickup or transfer of micro or nanostructures from a donor substrate to the stamp.

As used herein the expression "semiconductor element" and "semiconductor structure" are used synonymously and broadly refer to a semiconductor material, structure, device and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors. In addition, semiconductor element refers to a part or portion that forms an end functional semiconductor.

"Semiconductor" refers to any material that is a material that is an insulator at a very low temperature, but which has an appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers.

Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Relief features" refer to protrusions, extensions or projections on the bottom surface or external surface of the deformable layer, such as a three-dimensional relief pattern, that facilitates dry-transfer printing of semiconductor elements from a donor substrate to a target substrate. In an aspect, the relief features of the deformable layer define a printable surface area. "Printable surface area" or "region" refers to that portion of the stamp used to transfer structures from a donor substrate to a target substrate. "Active surface region" is used interchangeably with "printable surface region." A "pattern of relief features" refers to a plurality of features, including a plurality of nanostructures or microstructures, such as an array of features. The relief features may in turn be made from a plurality of distinct populations, with each population designed to serve a specific function. For example, one population may comprise printing posts for facilitating lift-off and transfer of semiconductor elements. Another population may comprise stability features for ensuring the stamp does not sag, buckle or otherwise undergo unwanted deformations during lamination and/or delamination with the receiving substrate surface. In an aspect, each population has different geometry, dimensions such as height, length or width, or is made from a material resulting in, for example, a different physical parameter such as an effective Young's modulus for that population. In an aspect, a population comprises a plurality of sub-populations.

"Lamination" refers to the process of bonding layers of a composite material or a process of producing contact between a first material or layer and a second layer or material (e.g., such as between the rigid backing and reinforcement layer, rigid backing and deformable layer, reinforcement layer and deformable layer, semiconductor element and transfer surface or receiving surface, for example). "Delamination" refers to the stamp transfer surface-semiconductor element separation or the stamp transfer surface-receiving substrate separation. In particular, for embodiments where the stamp has relief features that are printing posts inked with semiconductor elements, delamination rate refers to separation of the printing post surface from the semiconductor elements. Delamination rate may refer to a single post surface delaminating from an individual semiconductor element. Alternatively, delamination rate may refer to a spatially-averaged rate for all post surfaces within the printable surface region. In general, processes provided herein facilitate high transfer yield and placement accuracy for delamination rates that are substantially higher than conventional techniques. For example, the delamination rate may be two times higher, or as much as ten times higher for a shear-offset process, compared to conventional techniques without shear, without any measureable impact on transfer yield or placement accuracy.

"Substantially constant" refers to a variable that varies less than 10% compared to an average value. For example, a substantially constant delamination rate refers to a rate that varies less than 10% from an average rate over the delamination cycle. Substantially parallel refers to a direction that is at least within 10% of true parallel.

"Substrate" refers to a structure or material on which, or in which, a process is conducted, such as patterning, assembly and/or integration of semiconductor elements. Substrates include, but are not limited to: (i) a structure upon which semiconductor elements are fabricated, deposited, transferred or supported; (ii) a device substrate, for example an electronic device substrate; (iii) a donor substrate having elements, such as semiconductor elements, for subsequent transfer, assembly or integration; and (iv) a target substrate for receiving printable structures, such as semiconductor elements.

"Placement accuracy" refers to the ability of a pattern transfer method or device to generate a pattern in a selected region of a substrate. "Good placement" accuracy refers to methods and devices capable of generating patterning in a select region of a substrate with spatial deviations from the absolutely correct orientation less than or equal to 5 microns, particularly for generating patterns of semiconductor elements on target substrates.

"Operably connected" refers to a configuration of layers and/or device components of composite patterning devices of the present invention such that functionality of the components or layers are preserved when connected. Operably connected layers or device components, refers to an arrangement wherein a force applied to a layer or device component is transmitted to another layer or device component. Operably connected layers or device components may be in contact, such as layers having internal and/or external surfaces in physical contact. Alternatively, operably connected layers or device components may be connected by one or more connecting layers, such as thin metal layers or reinforcement layers, positioned between the internal and/or external surfaces of two layers or device components, or that run between two or more layers or components. In an embodiment, a rigid layer and a reinforcement layer are "operably connected" such that the stamp with the reinforcement layer is capable of withstanding a higher activation force without bowing or having the rigid layer fracturing or otherwise damaged compared to a stamp without the reinforcement layer.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

Processes provided herein achieve a high transfer printing yield of printable semiconductor elements with increased accuracy. Methods disclosed herein release printable semiconductor elements from the surface of a transfer printing stamp to the surface of a target substrate and overcome challenges presented by the significant adhesiveness of substrates used in conventional transfer printing. Adhesiveness of substrate surfaces slows delamination, adversely affects transfer quality and reduces overall transfer yields. Methods and devices presented herein permits transfer printing of printable semiconductor elements on substrates having a low tack surface and the realization of high speed printing of printable semiconductor elements with controlled and optimized transfer stamp delamination rates. The methods, systems and processes are scalable to various size elastomeric stamps and to various size donor, receiving or target substrates. A series of multi-facet and controlled tests demonstrate the advantages and performance merits of the disclosed devices and transfer printing methods, as evident through the descriptions, exemplary embodiments and figures that follow.

FIG. 1 illustrates the steps used in one embodiment of the invention for controlling the delamination of a transfer printing stamp. First the stamp 10 is populated with an array of printable semiconductor elements 20 using standard procedures as described in published dry transfer printing literature (see, e.g., U.S. Pat. No. 7,622,367 to Khang et al.). In an aspect, the semiconductor elements 20 are on a printing surface 72 corresponding to an external surface of a three-dimensional pattern of relief features 74. The stamp is brought into close proximity (i.e. within <100 µm) to a receiving substrate surface 30 (FIG. 1A). After precise optical alignment of the stamp 10 to the receiving substrate 30, the stamp is brought into conformal contact with the substrate by application of uniform air pressure 35 onto the stamp backing top surface 40 (FIG. 1B). Then, an in plane shear force 50 (e.g., applied in a direction substantially parallel to the x-y plane) is applied to the stamp by moving the tool head apparatus (holding the stamp) by a precise displacement offset (away from the aligned position) 65 and/or to the receiving substrate by a precise displacement of the receiving substrate (FIG. 1C). In this aspect, the shear force or displacement 50 can be applied to the stamp, the receiving surface, or both, so long as the result is an in plane displacement or shear offset 65 between the stamp and the receiving surface, without prematurely entirely breaking conformal contact between the inked stamp and the receiving surface, as shown in FIG. 1C. This shear force is transmitted to the stamp bottom surface, causing some elastic mechanical deformation of the stamp printing posts 70. Finally, the stamp is delaminated from the receiving substrate by moving the stamp 10 in the vertical (Z) direction 80 relative to the receiving surface 30 and simultaneously decreasing the air pressure 35 applied on the stamp backing (FIG. 1D). Vertical motion is indicated by the arrow 80 in the vertical direction where vertical motion can be controlled by moving the stamp 10, moving the substrate 30, or moving both relative to each other. Decrease in air pressure is represented by the decrease in the magnitude of arrows 35.

Figure 2:
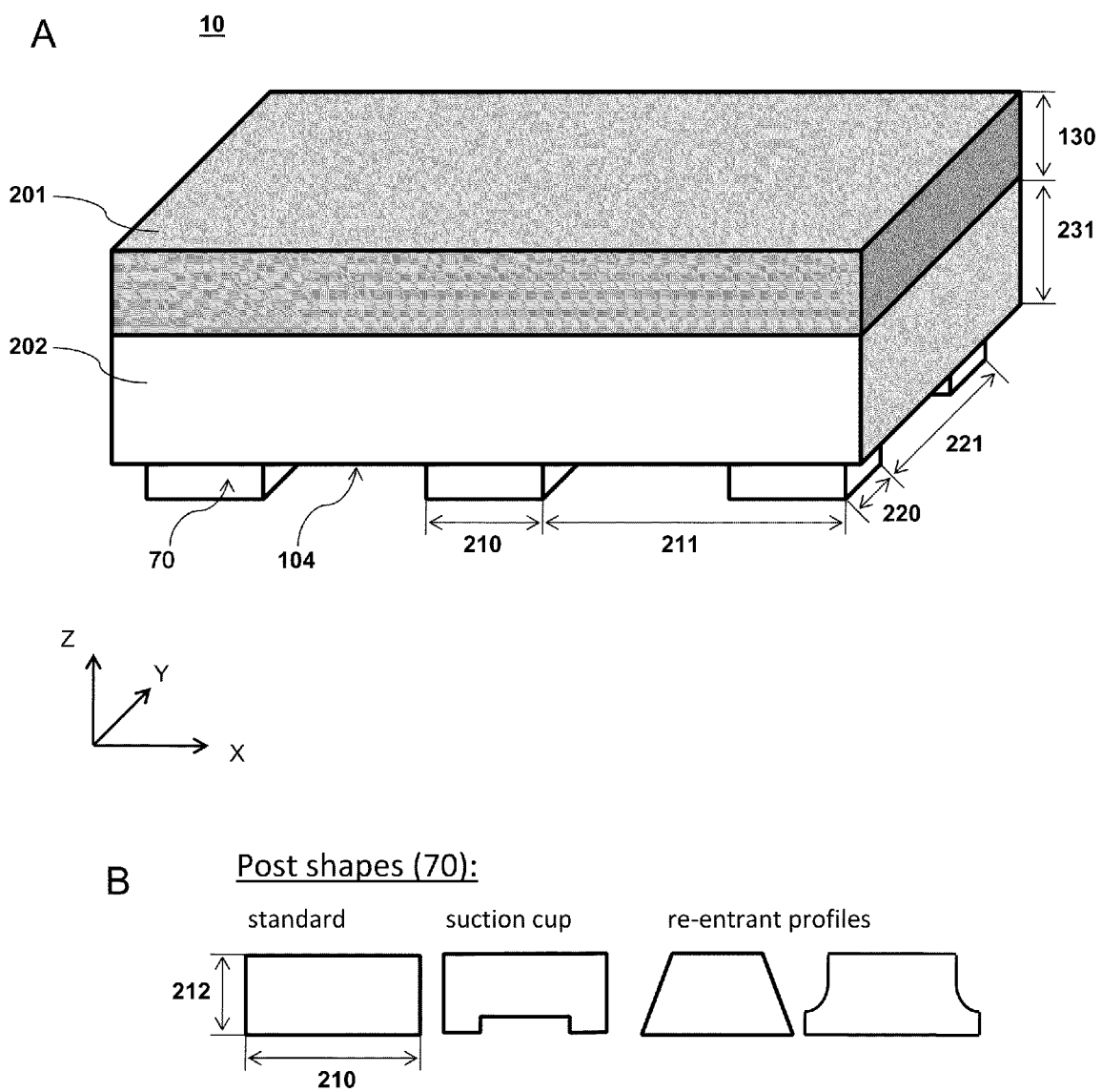
FIG. 2A is one example of a three dimensional schematic of a composite stamp that may be used for shear offset printing.
FIG. 2B provides an illustration of a schematic cross-sections of various stamp posts that may be used with shear offset printing.

FIG. 2A presents a three dimensional schematic of a composite stamp 10 that facilitates uniform transfer of an applied in-plane shear force (by the rigid stamp backing layer) over the entire surface of the stamp. The composite stamp is made of a rigid backing layer 201 connected to a top surface 205 of elastomeric layer 202 having relief 70 and recess 104 features. The different stamp dimensions such as the glass backing layer thickness 230, the elastomeric layer thickness 231, the stamps printing posts pitch in the X (211) and Y direction (221), the stamp printing posts width and length (210, 220) and the stamp printing posts height (212) each can influence the effect of the applied shear force and are optionally optimized to provide high yield and accurate transfer printing by the shear-offset methods disclosed herein. In an aspect, any one or more of these parameters are selected to achieve a desired transfer yield, placement accuracy and/or delamination rate constancy. The Young's modulus of the elastomer layer 202, shape of the stamp posts 70 (FIG. 2B) are optionally adjusted to maximize the efficiency of the shear assisted stamp release method. In an aspect, any one or more of these parameters are selected to achieve a desired transfer yield and/or placement accuracy. For example, FIG. 2B provides examples of four different post shapes: standard (having a selectable height 212, width 210, length (not shown)), suction cup and re-entrant profiles.

Figure 3:
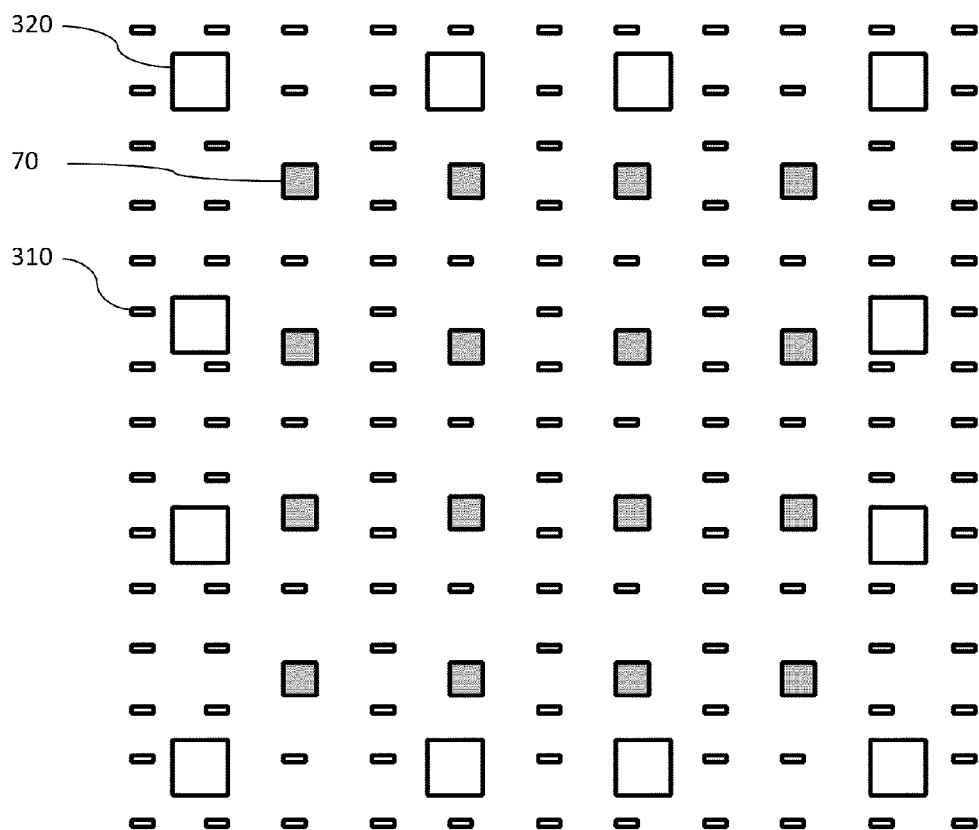
FIG. 3 provides one example of a layout for relief feature on a transfer surface of an elastomeric stamp, including anti-sag and stabilization features.

FIG. 3 presents a typical layout for a stamp post array including printing posts (70) and stabilization features (320), such as anti-sag features 310. The printing posts 70 are designed to support the printable semiconductor elements during the transfer printing cycle. The anti-sag features (310) are designed to support the recessed areas of the stamp (104) in order to avoid contact between these recessed areas and the surface of the donor/receiving substrates. Accordingly, in an embodiment, the anti-sag features have a height that is less than the height 212 of the printing posts shown in FIG. 2B. The stabilization features (320) can prevent buckling of the stamp surface, printing posts 70 or anti-sag features 310 when any of the features have, for example, high aspect ratios (i.e., height/width >1).

Figure 4:
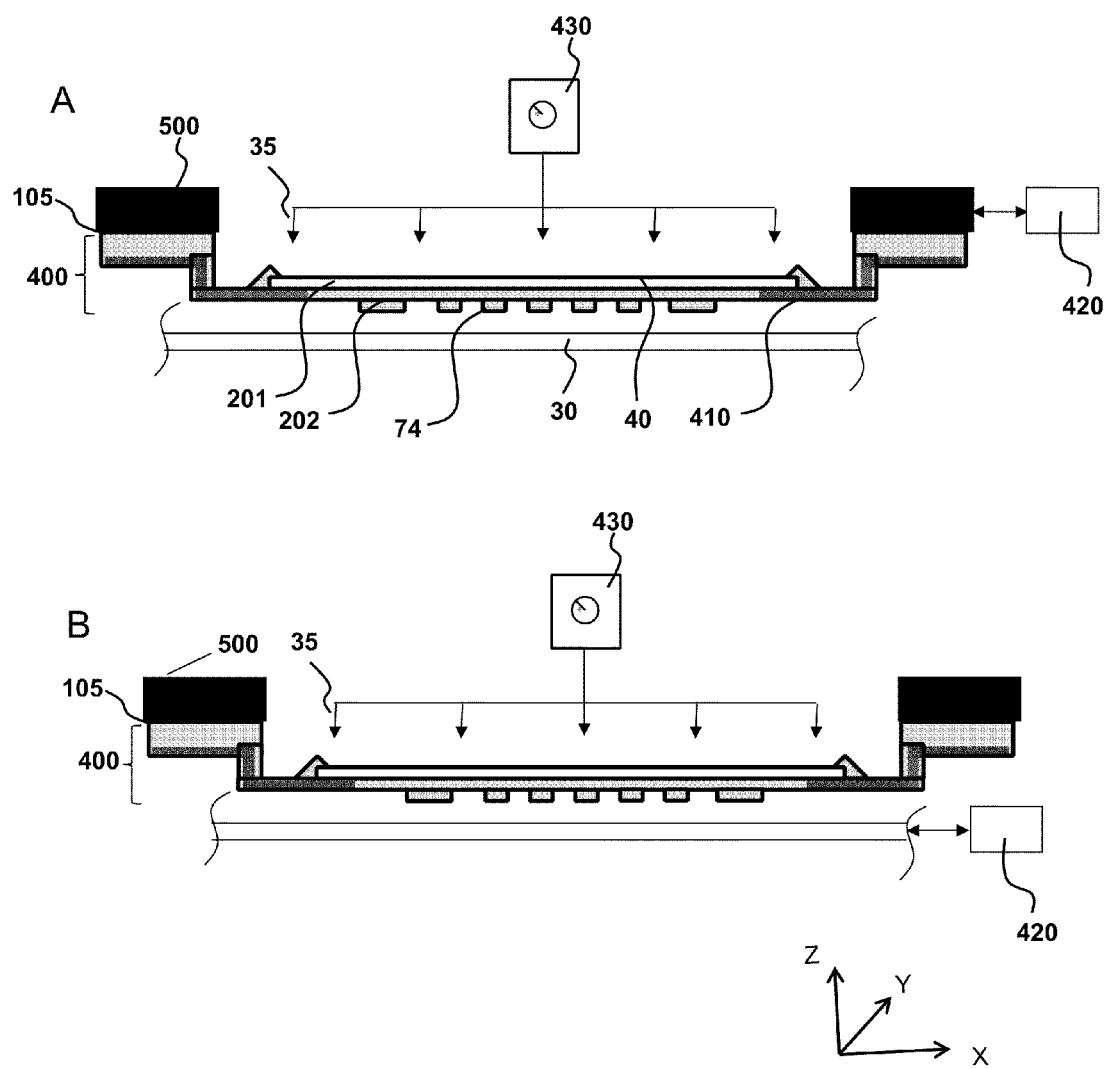
FIG. 4A provides a schematic cross-section showing a reinforced composite stamp attached to a transfer printing tool head apparatus. A is the embodiment for shear offset to the print tool head; B is the embodiment for shear offset to the receiving substrate; C is a photograph of one embodiment of a transfer printing tool.
Figure 4:
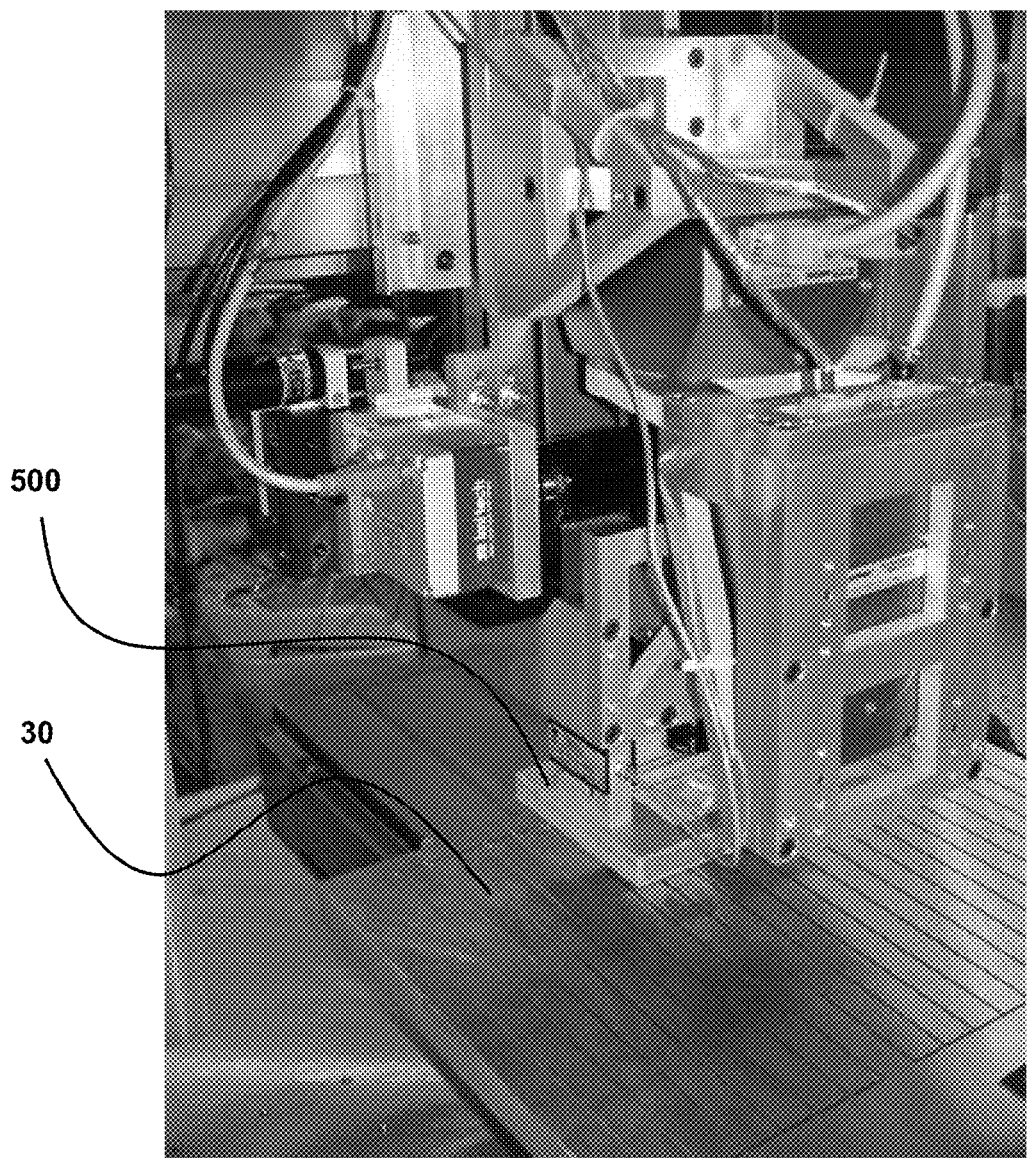

A schematic illustration of a device capable of providing shear offset printing of semiconductor elements is provided in FIG. 4. A composite stamp, such as any of the composite stamps disclosed in U.S. Pat. No. 7,927,976, filed Aug. 29, 2008, is connected to a print tool head 500. Further detail of tool head 500 is provided in U.S. Pat. No. 7,927,976, which is hereby specifically incorporated by reference for the composite stamps, devices for holding the composite stamps and printing processes, for example. A reinforced composite stamp 400, such as disclosed in U.S. Pat. No. 7,927,976, is made of a rigid backplane layer 201, connected to an elastomeric layer 202 having a relief pattern 74 that faces the receiving substrate surface 30, along with a reinforcement layer 410 in the elastomer layer and/or between the elastomer layer and rigid backing layer. Actuator 420 is any device known in the art capable of providing a controlled displacement, such as an in plane displacement. Pressure controller 430, such as an air pressure controller, provides controllable force application onto the stamp top surface 40 by application of a user-selectable uniform pressure 35 over the stamp top surface 40. In FIG. 4A, shear offset is provided by an in plane displacement of the stamp by in plane displacement of tool head 500 to which the composite stamp 400 is connected. Alternatively, shear offset is provided by in plane displacement of the receiving substrate 30 relative to the composite stamp 400, as shown in FIG. 4B. As used herein, "in plane displacement" refers to displacement in the x-y plane, as indicated by the xyz axis in FIG. 4. A displacement is said to be "in plane" if the direction of displacement is within 10%, within 5% or within 1% of parallel to the plane formed by the x-y axis shown in FIG. 4.

Figure 5:
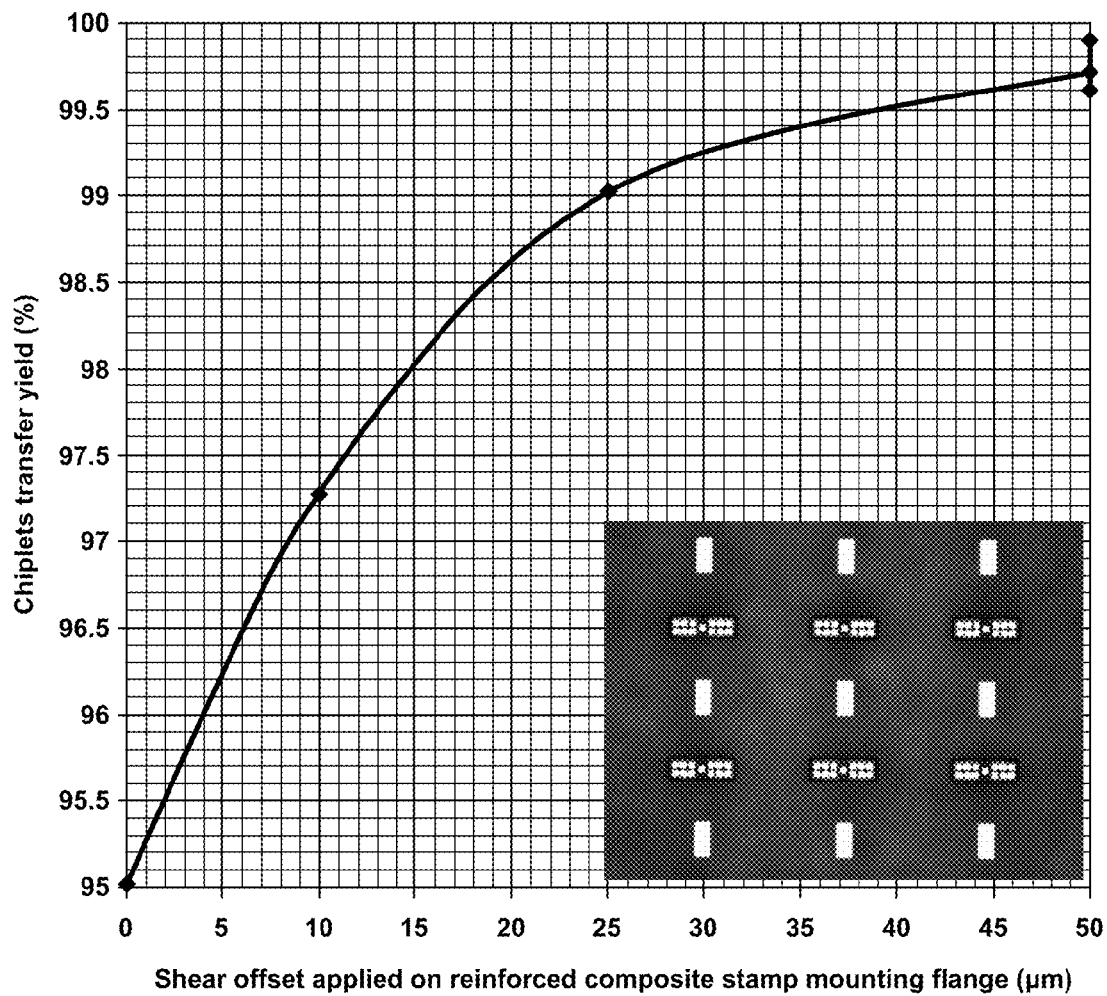
FIG. 5 is a graphical representation of silicon chiplets transfer printing yield as function of the shear offset applied on a reinforced composite stamp mounting flange as indicated by the arrows in FIG. 4A. The inset is a high resolution optical image of a 3×2 sub-array of transfer printed silicon chiplets.

FIG. 5 provides transfer yield of chiplets from a reinforced composite printing stamp (schematically represented on FIG. 4A) to a receiving surface. The reinforced composite stamp is mounted on a dry transfer printing tool (shown in FIG. 4C). A receiving glass substrate is coated with a thin layer of BCB (Cyclotene, Dow Chemical Co.). Each data point in FIG. 5 represents the average transfer yield of four successive dry transfer print of an array of 256 silicon chiplets, corresponding to a total of 1,024 chiplets per data point on the graph. For all experiments, the silicon chiplets have the following physical dimensions: length=167 µm, width=50 µm, thickness=5 µm. The inset of FIG. 5 is an optical image of six transfer printed silicon chiplets. These silicon chiplets have an array of 13 metal interconnection pads on their top surface. The stamp has an array of 16×16 posts with the following physical dimensions: posts pitch=185×185 µm, posts length=167 µm, width=50 µm, thickness=40 µm. The stamp has a glass backing layer with the following physical dimensions: disk diameter=76.2 mm, thickness ~200 µm. The reinforcement layer of the stamp is a ring of woven fiberglass consisting of Style 120 E-Glass fiberglass fabrics having a weight density of ~3 Oz/Yd2, and an average thickness of 90-115 µm, with a 4-Harness Satin style weave pattern. The reinforcement ring is laser cut into a perforated ring shape having the following physical dimensions: inner diameter of 54 mm, outer diameter of 120 mm, hole diameters of 2 mm. A constant shear offset is applied on the reinforced composite stamp mounting flange throughout the entire stamp delamination step. A different shear offset value is used in each experiment, resulting in an average transfer printing yield that varies with offset, as summarized in FIG. 5. A shear offset of zero corresponds to a conventional transfer printing process that does not use any shear offset. These results indicate that the shear force transferred to the stamp transfer printing posts provides a significant increase in transfer printing yields, including the chiplets transfer printing yields. FIG. 5 indicates that, under these experimental conditions, providing a shear offset of 50 μm increases semiconductor transfer yield from 95% to greater than 99.5%.

Figure 6:
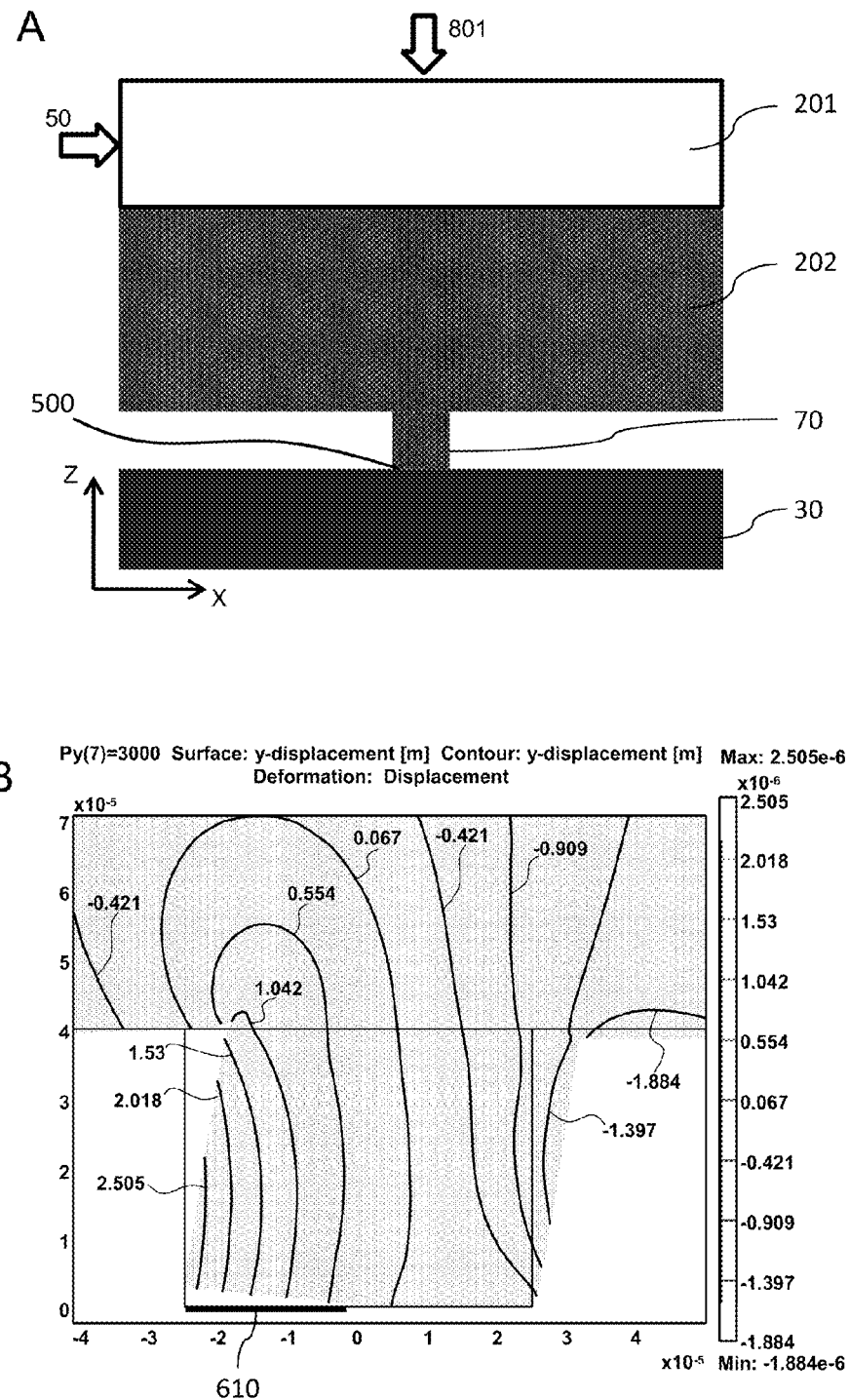
FIG. 6A is a schematic illustration of a composite stamp model used to perform finite element simulations of a stamp post undergoing delamination from a substrate under applied forces.
FIG. 6B is the finite element simulation results of the stamp post delaminating from a substrate illustrated in FIG. 5A. The vertical displacement of the stamp internal mesh elements are represented using a contour plot.

In order to better understand the physical mechanism underlying this process, finite element simulations are performed. FIG. 6A presents a schematic view of the model used to study the delamination of a single printing post. A shear offset 50 and a uniform force 801 is applied to the rigid stamp layer 201 that is connected to the elastomeric layer 202 having a printing post 70 with an evolving contact interface 500 between the printing face of the stamp and the receiving substrate 30. A non linear force boundary condition is used to model the evolving contact interface 500 between a stamp printing post and a target substrate. In order to facilitate convergence of the Newton-type iterative algorithms used by the simulation software, a low-order boundary condition is used:

$$F(z) = \frac{A}{(z+B)^3} - \frac{C}{(z+D)^2}$$

This boundary condition does not precisely model the Van der Walls and short range repulsion forces present at the stamp-substrate interface, but is nevertheless sufficient to appropriately predict the shape of a delaminating printing post. FIG. 6B presents a screen shot copy of a simulation run obtained for the case of a printing post (50 um wide, 40 um tall) delaminating from a substrate for a shear offset of 10 um applied to the (200 um thick) stamp glass backing layer with a portion of interface 500 having delaminated length 610.

Figure 7:
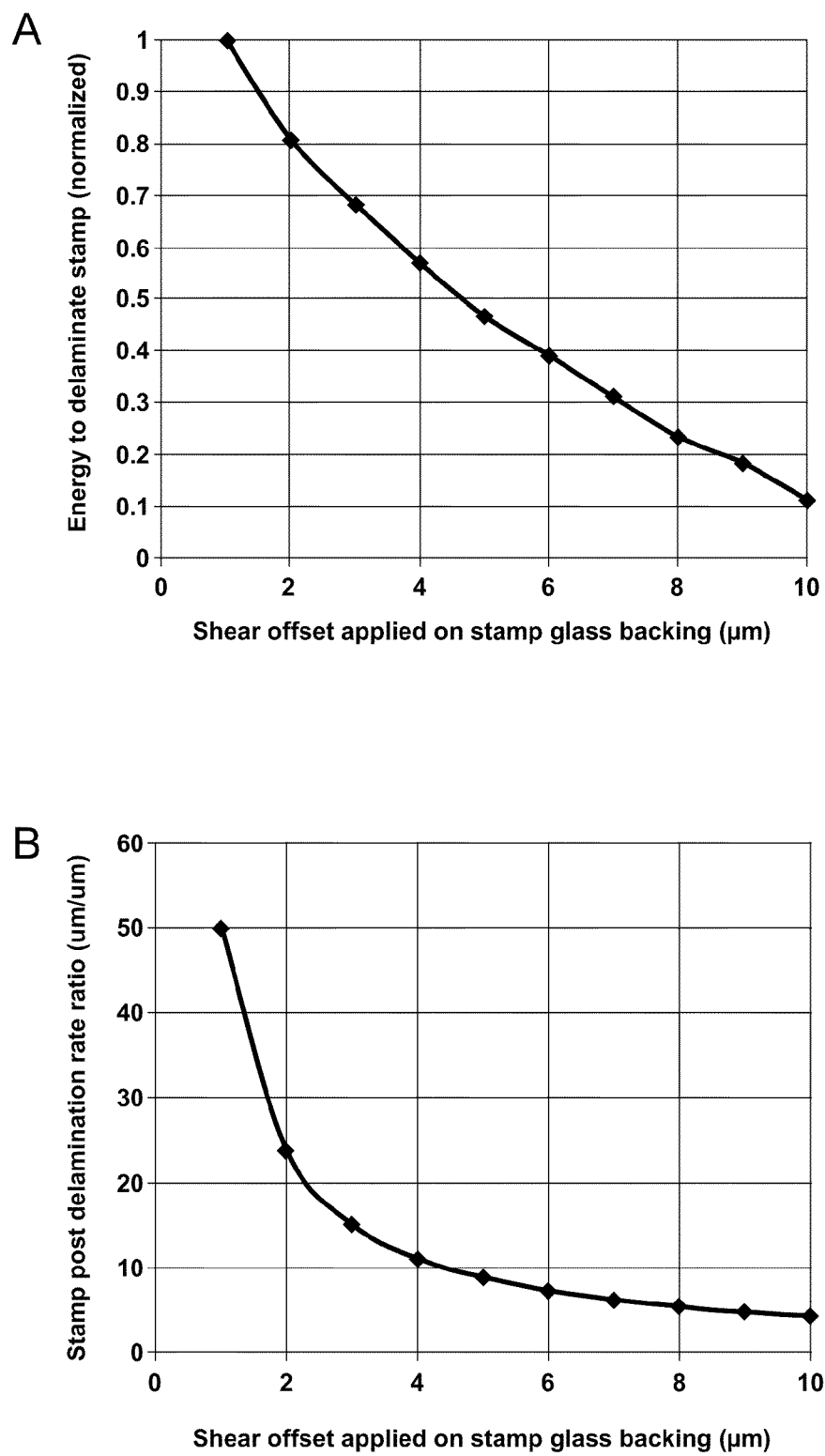
FIG. 7A is a plot of the in silico results of the energy normalized to the maximum calculated energy necessary to delaminate a composite stamp post as a function of the shear offset applied on the stamp glass backing layer.
FIG. 7B is a plot of the in silico results of the delamination rate of a composite stamp post as a function of the shear offset applied on the stamp glass backing layer.

Analysis of the simulation results indicates the shear offset delamination process disclosed herein is effective with respect to two different aspects. Firstly, shear offset is an effective process for controlling the delamination rate, and particularly the delamination rate of stamp printing posts from the target or receiving substrate. FIG. 7B presents the variation of the stamp printing post delamination rate ratio as a function of the shear offset applied on the stamp glass backing layer. "Delamination rate ratio" refers to the horizontal displacement of the posts delamination front per vertical displacement of the stamp glass backing layer. These in silico results reveal that the application of a shear offset on the stamp glass backing causes a substantial decrease of the stamp printing post delamination rate, and corresponding decrease in the energy required to delaminate the stamp (see FIG. 7A). Slower and steady stamp delamination rates typically result in higher printing yields on most surfaces. Application of shear offset, however, allows higher delamination rates to be achieved, without sacrifice of printing yield, compared to conventional techniques that do not apply a shear offset.

Even when stamps are delaminated at slow peel rates, it is difficult to obtain high transfer printing yields on surfaces typically encountered on plastic substrates, particularly for those surfaces that are not ultra-smooth. The "shear" method disclosed herein significantly enhances printing yields, as the energy required to separate the printing post from the target substrate can be minimized (see FIG. 7A). A significant fraction of this energy is stored as mechanical strain energy in the deformed stamp printing post. FIG. 7A presents the variation of the normalized energy to delaminate a stamp printing post as a function of the shear offset applied on the stamp glass backing. This energy is obtained by integrating the work done by the boundary forces at the interface between the stamp printing posts and the chiplets. These in silico results suggest that the minimization of the work of adhesion (energy to delaminate the deformed stamp printing posts) is responsible for the experimentally observed enhancement of the transfer printing yields.

Figure 8:
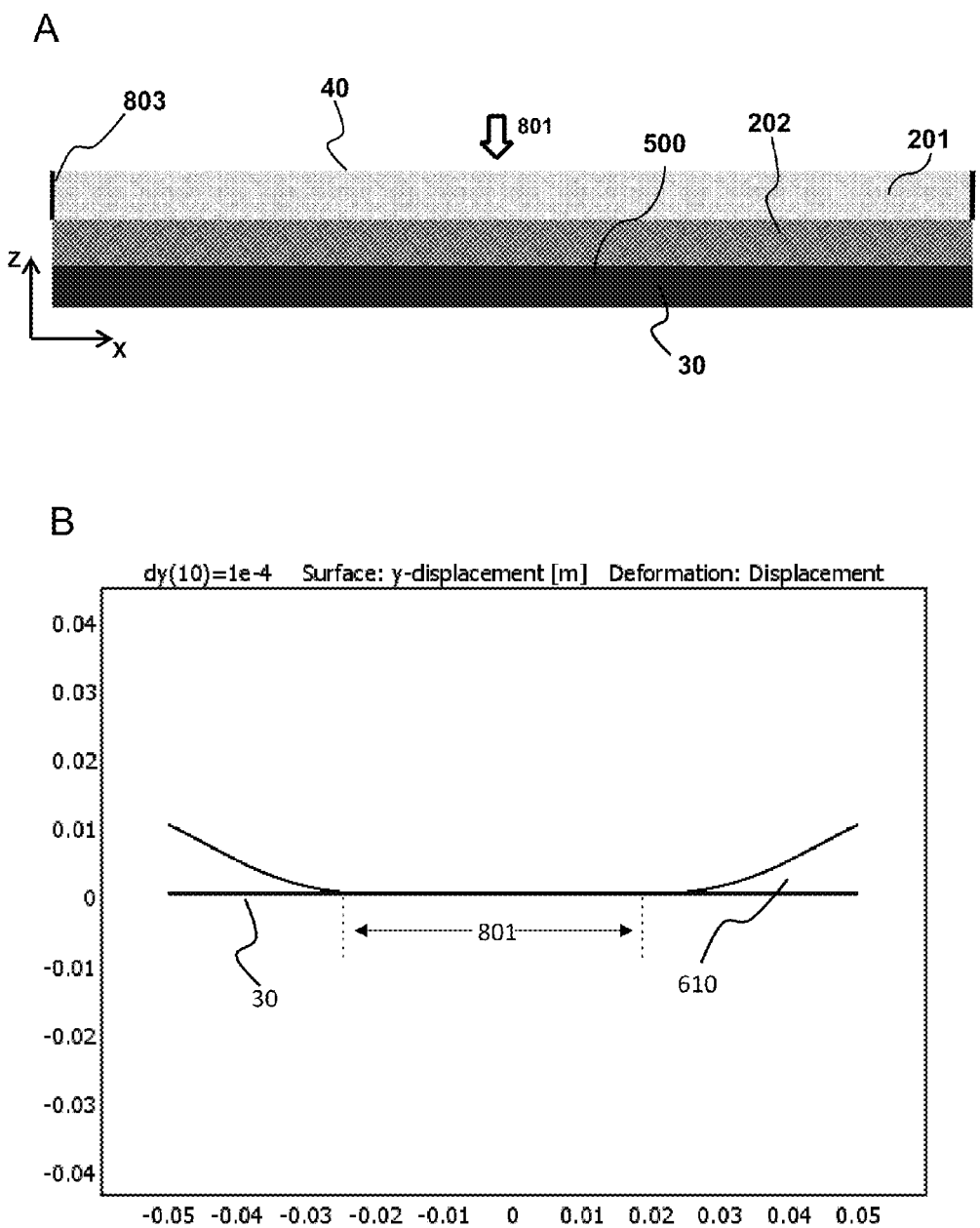
FIG. 8A provides a schematic illustration of a composite stamp model used to perform finite element simulations of a flat (non-structured printing surface) stamp delaminating from a substrate.
FIG. 8B provides finite element simulation results of the composite stamp of FIG. 7A delaminating from a substrate. The vertical displacement of the stamp internal mesh elements is indicated. To improve the figure clarity, the stamp deformed shape is magnified by a factor of 100.

In order to obtain high transfer printing yields, it is desirable to maintain steady delamination rates of the transfer printing stamps. Finite element simulations are performed to analyze the variation of the stamp delamination rate when a composite stamp is delaminated from a target substrate. FIG. 8A is a schematic illustration of the stamp system used to study delamination for a flat transfer surface geometry. The same non linear force boundary condition is used to model the evolving contact interface 500 between the stamp transfer surface on the outside surface of elastomeric layer 202 that is connected to rigid backing layer 201 and the target substrate receiving surface 30. The outside edges 803 of the stamp glass backing layer 201 are subject to forced position boundary conditions ($\Delta x=0$, $\Delta z$). A uniform pressure (e.g., a force 801 per unit area) is applied on the top surface 40 of the composite stamp glass backing (corresponding to an applied force 801), simulating the action of air pressure that is applied to the top surface of the stamp (e.g., the top surface of the rigid backing layer). This study is conducted for a composite stamp without any relief features (e.g., flat transfer surface) in order to obtain a continuous variation of the stamp delamination front. This specific case also simplifies the analysis and reduces the complexity of the computer model mesh. FIG. 8B presents a coded plot of a composite stamp of FIG. 8A delaminating 610 from a substrate receiving surface 30. The stamp deformation is magnified by a factor 100 in order to emphasize the shape of the stamp sections delaminated 610 from the substrate 30. The modeled composite stamp has: width of 100 mm, glass backing thickness of 200 um, elastomeric layer thickness of 200 um. In this specific case, the stamp edges 803 are forced to move vertically 100 μm from the target substrate 30. A uniform pressure of 0.5 kPa is applied on the composite stamp glass backing top surface 40.

Two different parametric simulations are conducted so as to decouple the influence of the air pressure and the vertical motion of the stamp glass backing edges on the delamination of the stamp. First, the stamp glass backing outside edges 803 are kept at a fixed Z-offset position (100 μm vertical separation from the target substrate 30) and the air pressure force applied on the glass backing is progressively decreased from 5 kPa to 0.5 kPa.

Figure 9:
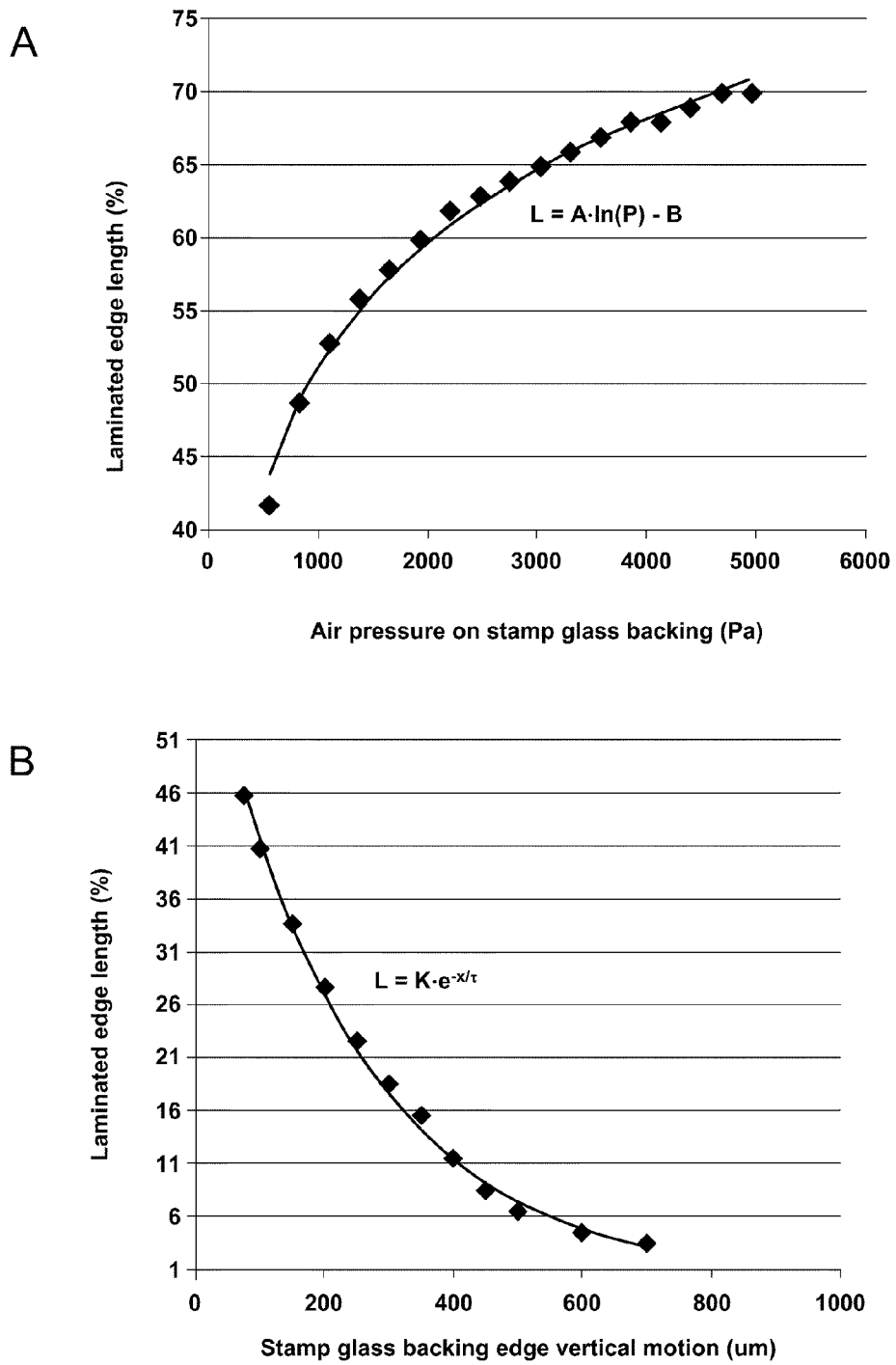
FIG. 9A provides finite element simulation results of a composite stamp laminated edge length as a function of the air pressure applied on the composite stamp glass backing.
FIG. 9B provides finite element simulation results of a composite stamp laminated edge-length as a function of the vertical displacement of the stamp outer edges.

FIG. 9A presents the variation of the stamp laminated edge length 801 (see FIG. 8B) as a function of the applied air pressure. "Laminated edge length" refers to the length of stamp in conformal contact with the target or receiving substrate 30. During the process of shear-offset printing, the laminated edge length decreases from a maximum at the beginning of the transfer to zero when the stamp is vertically displaced from the receiving substrate. These results indicate that the stamp laminated edge length rapidly decreases when the applied air pressure drops below 1 kPa. It is, therefore, desirable to maintain some level of residual air pressure on the composite stamps during the delamination step in order to avoid a sudden variation of the stamp wetting from delamination rate. In FIG. 9A, the air pressure applied to the glass backing is maintained constant (0.5 kPa) and the stamp glass backing outside edges 803 are progressively moved away from the target substrate in a vertical direction.

FIG. 9B presents the variation of the stamp laminated edge length 801 as function of the stamp glass backing outside edge vertical displacement (relative to the receiving substrate surface). These results indicate that the stamp laminated edge length quickly decreases during the initial motion of the glass backing outside edges away from the substrate. It is thus desirable to maintain higher air pressure forces on the composite stamp during the beginning of delamination step in order to avoid a sudden variation of the stamp wetting from delamination rate. This suggests it can be beneficial to apply a time-varying pressure to the top surface of the stamp, specifically the top surface of the rigid backing layer that decreases from an initial maximum value.

In summary, these in silico results suggest that to maintain better and more precise control over the composite stamp delamination rates it is preferable to control the air pressure applied on the composite stamp backing at the beginning of the delamination cycle and to control the vertical motion of the stamp glass backing outside edges at the end of the delamination cycle. Steady and constant stamp delamination rates can be obtained if the applied air pressure and outside edge vertical motion are properly modulated, thereby obtaining a substantially constant delamination rate with attendant improvement in transfer printing yield.

Figure 10:
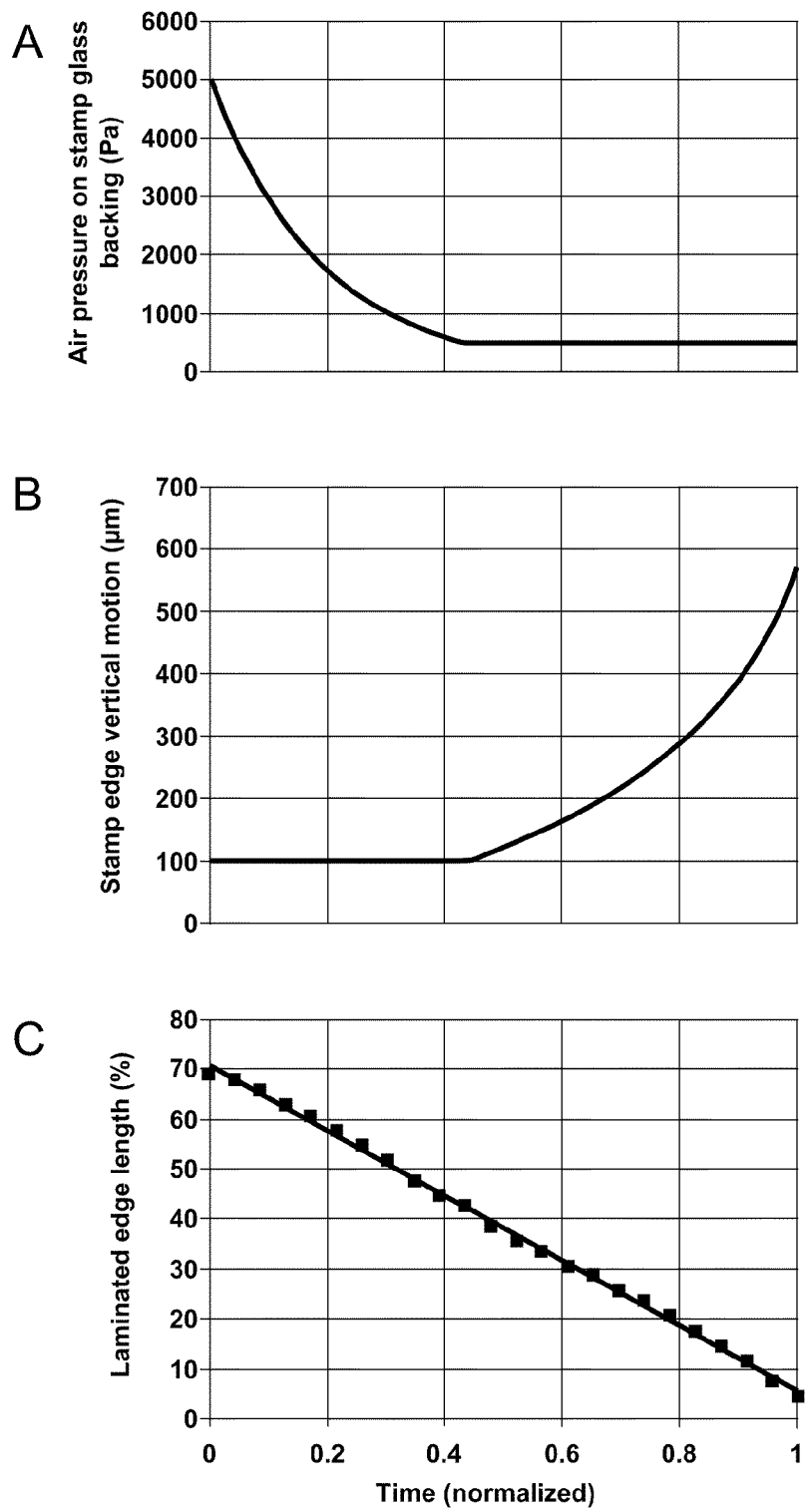
FIG. 10A provides model predictions of a pressure profile over time to achieve a constant delamination rate of 65 mm per normalized time unit of a composite stamp.
FIG. 10B provides model predictions of a vertical motion time course (e.g., rate of vertical separation between stamp edge and substrate) to achieve a constant delamination rate of a composite stamp.
FIG. 10C provides finite element simulation results of composite stamp delamination rate by plotting laminated edge length as a function of time (normalized), when optimized pressure and vertical motion profiles are implemented.

FIGS. 10A and 10B are exemplary protocols of modulating or optimizing air pressure and vertical displacement during a stamp delamination cycle, wherein the air pressure (FIG. 10A) and the stamp edge vertical separation (FIG. 10B) change over time (t=0, start of the delamination cycle; t=1 end of the delamination cycle). During the first part of the delamination cycle the air pressure applied on the stamp glass backing is exponentially decreased and the stamp outside edges are maintained at a fixed Z position. During the second part of the delamination cycle the air pressure applied on the stamp glass backing is kept constant, at a relatively lower value, and the stamp outside edges are moved vertically away from the target substrate following a logarithm equation. FIG. 10C presents the time dependant variation of the stamp laminated length. The linear plot indicates that the delamination rate is substantially constant. These results indicate that steady stamp delamination rates can be obtained by selectively varying parameters, for example the pressure on the top surface of the stamp and the vertical separation distance, over time.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure.

Every formulation or combination of components described or exemplified herein can be used to practice the invention, unless otherwise stated.

Whenever a range is given in the specification, for example, a temperature range, a size or distance range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

I claim:

1. A method of printing a transferable semiconductor element, said method comprising:
   providing an elastomeric stamp having a transfer surface with said semiconductor element supported thereon, wherein said transfer surface comprises a three-dimensional pattern of relief features that at least partially contacts said semiconductor element;
   providing a substrate having a receiving surface;
   establishing conformal contact between said semiconductor element supported on said elastomeric stamp transfer surface and said receiving surface, thereby contacting at least a portion of said semiconductor element with said receiving surface;
   offsetting said elastomeric stamp a horizontal distance relative to said receiving surface, thereby generating a mechanical deformation in at least a portion of said pattern of relief features without separating said semiconductor element from said transfer surface or said receiving surface; and
   separating said stamp from said receiving surface, thereby printing said semiconductor element to said receiving surface;
   wherein said offsetting step displaces relative to the substrate an upper portion of the relief feature without displacing relative to the substrate the stamp transfer surface that supports the semiconductor element; wherein the relief feature upper portion is separated from the stamp transfer surface by a vertical distance.

2. The method of claim 1, wherein said conformal contact step is established by applying air pressure to a top surface of said elastomeric stamp.

3. The method of claim 1, wherein said offsetting step comprises applying an in plane displacement to said elastomeric stamp.

4. The method of claim 3, wherein said in plane displacement comprises a horizontal displacement of said top surface relative to said receiving surface that is greater than 5 μm and less than 100 μm.

5. The method of claim 2, wherein said separating step comprises decreasing said air pressure applied to said stamp top surface.

6. The method of claim 1, wherein said elastomeric stamp further comprises:
   an elastomeric layer having a top surface that is opposite said transfer surface; and
   a rigid backing layer having a bottom surface, wherein said bottom surface is positioned adjacent to said elastomeric layer top surface.

7. The method of claim 6, wherein said elastomeric stamp further comprises a reinforcement layer operably connected to said rigid backing layer, said reinforcement layer having an opening that vertically coincides with at least a portion of said relief features on said transfer surface.

8. The method of claim 1, further comprising mounting said elastomeric stamp to a dry transfer printing tool, wherein said offsetting step comprises applying an in plane displacement to said dry transfer printing tool, thereby generating a mechanical deformation of at least a portion of said relief features.

9. The method of claim 8, further comprising applying a pressure to a top surface of said mounted stamp, thereby establishing conformal contact between said stamp and said receiving surface.

10. The method of claim 9, wherein said stamp is separated from said receiving surface by moving said transfer printing tool mounted to said elastomeric stamp in a vertical direction relative to said receiving surface.

11. The method of claim 10, wherein said pressure varies during said vertical direction movement that separates said stamp from said receiving surface.

12. The method of claim 11, wherein said pressure decreases from a maximum value to a minimum value, wherein said maximum value is between 4 kPa and 10 kPa and said minimum value is between 0 kPa and 2 kPa.

13. The method of claim 12, wherein said pressure decrease rate and said vertical direction movement rate are selected to provide a delamination rate of said relief features from said receiving surface that is substantially constant.

14. The method of claim 1, wherein said relief features comprise a plurality of posts.

15. The method of claim 14 wherein said plurality of posts has a contacting area fraction on said transfer surface selected from a range that is greater than 1% and less than 25%.

16. The method of claim 15, wherein said relief features further comprise:
   a plurality of stabilization features interspersed between said posts, wherein said stabilization features have a contacting area that is less than the contacting area of said posts.

17. The method of claim 1, wherein said semiconductor printing provides a transfer printing yield and said yield is:
   greater than or equal to 99.5% for a receiving surface that is coated with a thin layer of adhesive; or
   greater than or equal to 99.5% for stamp delamination rates that are greater than or equal to 1 mm/s.

18. The method of claim 1 further comprising:
   optically aligning said stamp with said receiving surface;
   positioning said semiconductor elements to within less than or equal to 100 μm vertical separation distance from said receiving surface; and
   applying a pressure to a top surface of said stamp, thereby establishing conformal contact between said stamp and said receiving surface.

19. The method of claim 18, wherein said pressure is applied by application of a uniform air pressure to said stamp top surface.

20. The method of claim 1, wherein said pattern of relief features support a plurality of semiconductor elements.

21. The method of claim 1, wherein said receiving surface is a low-tack surface.

22. The method of claim 1, wherein said separating step comprises displacing said stamp relative to said receiving surface by applying a vertical offset to said stamp or to said receiving surface.

23. The method of claim 1, wherein said offsetting step is provided by:
   applying an in-plane displacement to said stamp; or
   applying an in-plane displacement to said receiving surface.

24. The method of claim 1 further comprising:
   applying an air pressure to at least partially establish said conformal contact; and
   vertically separating said stamp from said receiving surface;
   wherein said air pressure varies over a first time interval and said vertical separation is maintained constant over said first time interval; and said air pressure is maintained constant over a second time interval that does not overlap said first time interval, and said vertical separation increases during said second time interval, thereby maintaining a delamination rate that deviates less than or equal to 5% from an average delamination rate over said first and second time intervals.

25. The method of claim 1, wherein said offsetting improves a transfer yield of said semiconductor element compared to a transfer yield for a method wherein said elastomeric stamp is not offset.

26. The method of claim 25, wherein said transfer yield improvement compared to the transfer yield of the not offset elastomeric stamp is greater than 4%.

27. The method of claim 1, wherein the conformal contact further comprises physical contact between said receiving surface and a plurality of stabilization features of said elastomeric stamp.

28. The method of claim 1, wherein the mechanical deformation in the elastomeric stamp relief features decreases an initial delamination energy for transfer of the semiconductor element from the elastomeric stamp transfer surface.

29. The method of claim 28, wherein the decrease in initial delamination energy is between about 0.1 to 0.8 times the delamination energy of a not offset elastomeric stamp.

* * * * *